(12) United States Patent
Zhang et al.

(10) Patent No.: US 11,756,718 B2
(45) Date of Patent: Sep. 12, 2023

(54) GALVANIC ISOLATION OF INTEGRATED CLOSED MAGNETIC PATH TRANSFORMER WITH BT LAMINATE

(71) Applicant: TEXAS INSTRUMENTS INCORPORATED, Dallas, TX (US)

(72) Inventors: Zhemin Zhang, Allen, TX (US); Roberto Giampiero Massolini, Pavia (IT); Joyce Marie Mullenix, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1156 days.

(21) Appl. No.: 16/236,571

(22) Filed: Dec. 30, 2018

(65) Prior Publication Data
US 2020/0211754 A1    Jul. 2, 2020

(51) Int. Cl.
H01F 17/00 (2006.01)
H01F 19/08 (2006.01)
H01L 25/16 (2023.01)

(52) U.S. Cl.
CPC ......... *H01F 19/08* (2013.01); *H01F 17/0013* (2013.01); *H01F 2017/0066* (2013.01);
(Continued)

(58) Field of Classification Search
CPC ............... H01F 19/08; H01F 2019/085; H01F 2017/0066; H01F 2017/0086;
(Continued)

(56) References Cited

U.S. PATENT DOCUMENTS

| | | | |
|---|---|---|---|
| 5,402,098 A * | 3/1995 | Ohta | H01F 27/2804 336/200 |
| 5,754,088 A * | 5/1998 | Fletcher | H05K 1/165 336/200 |

(Continued)

FOREIGN PATENT DOCUMENTS

| | | | | |
|---|---|---|---|---|
| EP | 715322 A1 * | 6/1996 | | H01F 17/0006 |
| EP | 3067903 A1 * | 9/2016 | | H01F 27/08 |
| JP | 58201391 A * | 11/1983 | | |

*Primary Examiner* — Tszfung J Chan
(74) *Attorney, Agent, or Firm* — Frank D. Cimino

(57) ABSTRACT

A transformer respectively includes a first isolation barrier, a first inductive element, a second isolation barrier, and a second inductive element. The first isolation barrier and second isolation barrier each comprise multiple isolation layers. The transformer also includes magnetic material including a top magnetic portion disposed above the first isolation barrier. The transformer also includes a bottom magnetic portion disposed below the second inductive element; The transformer further includes an intermediary magnetic portion extending from the top magnetic portion to the bottom magnetic portion via a through-hole within the first isolation barrier, first inductive element, second isolation barrier, and second inductive element. The transformer yet further includes at least one lateral magnetic portion extending from the top magnetic portion to the bottom magnetic portion. The at least one lateral magnetic portion is disposed laterally from the first isolation barrier, first inductive element, second isolation barrier, and second inductive element.

26 Claims, 5 Drawing Sheets

(52) U.S. Cl.
CPC ............... *H01F 2017/0086* (2013.01); *H01F 2019/085* (2013.01); *H01L 25/16* (2013.01)

(58) Field of Classification Search
CPC ............. H01F 17/0013; H01F 27/2804; H01F 2027/2809; H01F 17/0006; H01F 5/003; H01L 25/16
USPC .................................................. 336/200, 232
See application file for complete search history.

(56) References Cited

U.S. PATENT DOCUMENTS

| | | | |
|---|---|---|---|
| 5,760,671 A * | 6/1998 | Lahr | H01F 30/10 336/200 |
| 5,949,321 A * | 9/1999 | Grandmont | H01F 17/0006 336/200 |
| 6,249,762 B1 * | 6/2001 | Kirsteins | H04L 25/03006 704/219 |
| 8,824,161 B2 * | 9/2014 | Askarinya | H01F 27/2804 336/200 |
| 9,035,422 B2 | 5/2015 | Khanolkar et al. | |
| 2006/0152911 A1 * | 7/2006 | Humbert | H01L 23/50 361/783 |
| 2011/0140824 A1 * | 6/2011 | Herhold | H01F 27/2804 336/200 |
| 2013/0222101 A1 * | 8/2013 | Ito | H01F 3/08 336/83 |
| 2015/0069572 A1 * | 3/2015 | Khanolkar | H01L 28/10 257/531 |
| 2015/0302972 A1 * | 10/2015 | Yonezawa | H01F 27/2804 336/200 |
| 2017/0178787 A1 * | 6/2017 | Massolini | H01F 41/04 |
| 2017/0194088 A1 * | 7/2017 | Massolini | H01F 27/2804 |

* cited by examiner

GALVANIC ISOLATION OF INTEGRATED CLOSED MAGNETIC PATH TRANSFORMER WITH BT LAMINATE

BACKGROUND

Galvanic isolation is the principle of isolating sections of circuits to prevent current flow between the sections. This can be achieved by capacitive or inductive methods. However, the isolation is frequently a limiting factor in circuit design. High quality isolation transformers typically are wire wound transformers, which are large and expensive. The size of such transformers makes them impractical for smaller footprint circuit designs such as integrated circuits (IC's). Small isolation transformers typically have poor isolation rating.

SUMMARY

In one aspect, a transformer includes a first isolation barrier extending in an axial direction. The first isolation barrier includes at least two first isolation layers. The transformer also includes a first inductive element disposed below the first isolation barrier and extending in the axial direction. The transformer further includes a second isolation barrier disposed below the first inductive element and extending in the axial direction. The second isolation barrier includes at least two second isolation layers. The transformer yet further includes a second inductive element disposed below the second isolation barrier and extending in the axial direction. The transformer yet further includes magnetic material. The magnetic material includes a top magnetic portion disposed above the first isolation barrier and extending in the axial direction. The magnetic material also includes a bottom magnetic portion disposed below the second inductive element and extending in the axial direction. The magnetic material further includes an intermediary magnetic portion extending from the top magnetic portion to the bottom magnetic portion via a through-hole within the first isolation barrier, first inductive element, second isolation barrier, and second inductive element. The magnetic material yet further includes at least one lateral magnetic portion extending from the top magnetic portion to the bottom magnetic portion. The at least one lateral magnetic portion is disposed laterally from the first isolation barrier, first inductive element, second isolation barrier, and second inductive element in the axial direction.

DETAILED DESCRIPTION

Figure 1:
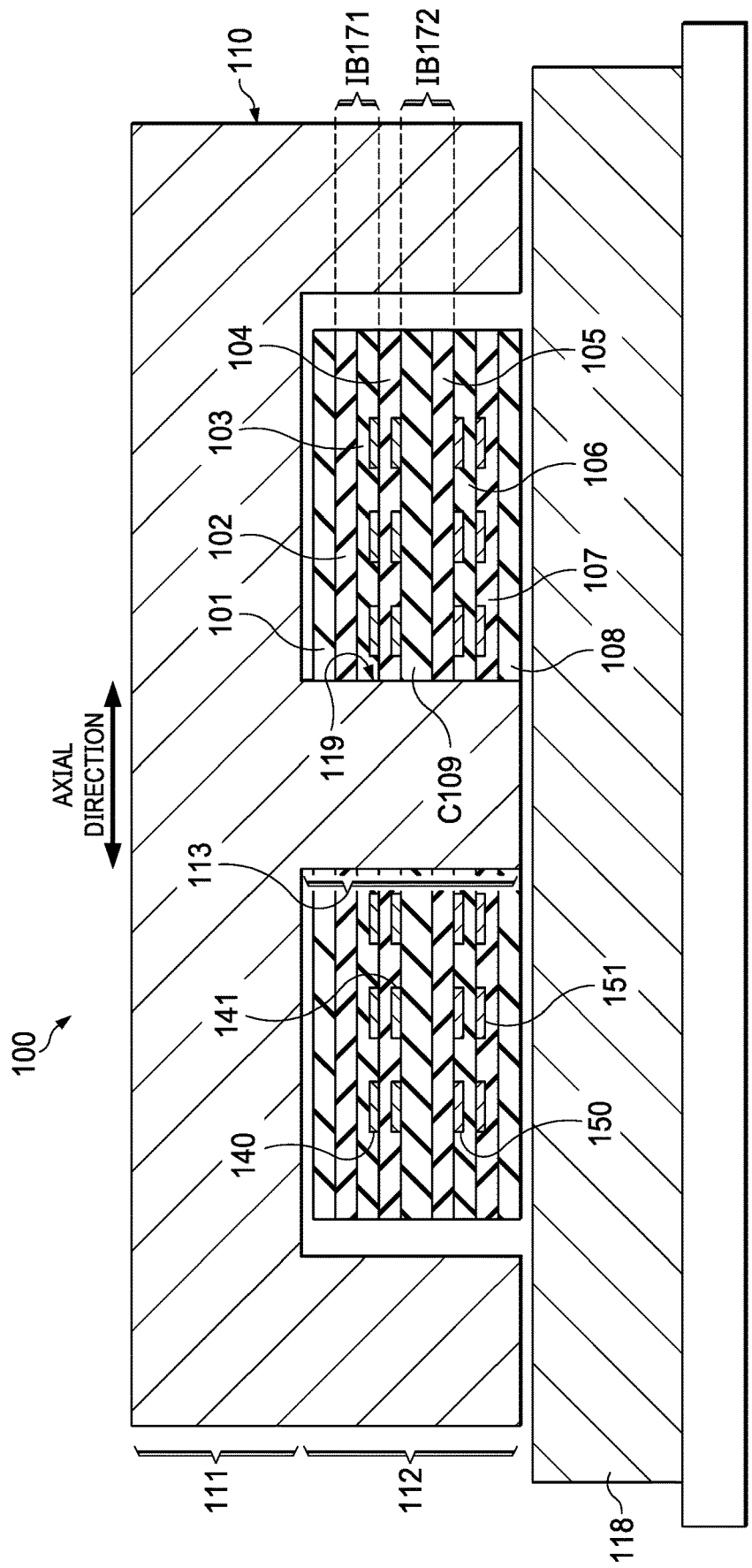
FIG. 1 is a cross-sectional side view of a transformer, in accordance with this description.

The described examples pertain to an isolation device made to operate using a higher isolation voltage by using multiple layers of high pressure laminate as the bilayer insulating barrier above and below a primary coil for an isolation transformer. In some examples, the isolation device is packaged in a single multi-chip integrated circuit package. The integrated circuit package contains one or more integrated circuits and a multilayer laminate isolation transformer all mounted to a common lead frame.

In accordance with this description, an isolation structure is described comprising double-layered pre-impregnated ("pre-preg") isolation barriers surrounding the first inductive element. Pre-preg refers to a reinforcing fabric which has been pre-impregnated with a resin system. This resin system, typically epoxy, includes a suitable curing agent. As a result, the pre-preg is ready to use without the addition of more resin. The laminate is cured by a combination of heat and pressure. This isolation structure, combined with magnetic material that extends via a through-hole in the laminate structure, provides superior reinforced isolation and a relatively high quality factor due to low eddy current loss from the first and second inductive elements. In contrast, previous transformer structures with only a single isolation layer barrier between the two coils (i.e., not a double layer isolation barrier and not a double layer isolation barrier surrounding a coil on both sides of the coil) have a low quality factor due to high eddy current loss from coils, and limited inductance density caused by a large air gap in the laminate structure.

Thus, as briefly described above, in order to close the magnetic path of the transformer, a through-hole is drilled in the center of the laminate structure such that the isolation barriers are intentionally disturbed. The magnetic core is assumed to have the same voltage potential on each side. The double-layer pre-preg layer surrounding the primary coil of the transformer advantageously isolates the coil from the magnetic core and the secondary coil.

Compared to discrete transformers, the integrated transformer described herein is a cost effective solution which can sustain high isolation and within a small form factor. Bilayer isolation in the laminate reduces the total isolation thickness compared to a thickness needed with a single isolation layer, thereby making the integrated transformer suitable for Small Outline Integrated Circuit (SOIC) co-packaging. In other words, a combination of each of the at least two isolation layers comprising an isolation barrier of the integrated transformer has a thickness which is less than a thickness of a single layer isolation barrier of discrete transformers.

The integrated transformer of this description also overcomes the limitations of previous laminate transformer structures whose inductance density and quality factor are low due to a large air gap and high eddy current loss from the coils.

In operation, the double layer isolation barriers of this description prevent the direct flow of electrical current between the two inductive elements. The magnetic material prevents substantial flux leakage outside of the transformer. This reduced flux leakage results in a relatively high quality factor. For example, the described examples in this description may obtain a quality factor of at least 35 at 8 MHz for several microhenry of inductance. The magnetic material has the added effect of shielding the transformer from electrical interference form the surrounding circuit. The reduced flux leakage also protects the surrounding circuit from interference caused by the transformer.

It has been discovered that by using multiple layers for each isolation barrier to isolate the primary and secondary coils of the transformer, a higher voltage breakdown value can be obtained while providing superior isolation advantages. In aspects of this description, the at least two isolation layers comprising each isolation barrier will have combined thicknesses. Each combined thickness of the multiple isolation layers of each isolation barrier will have a higher voltage breakdown than a single layer having a same thickness as either of the combined thicknesses.

In aspects of this description, isolation layers comprising the isolation barriers are laminate materials that include bismaleimide triazine (BT) and that have a high breakdown strength of 100-120V/um. Such material may be obtained from Mitsubishi Gas Chemical (MGC) as copper clad laminates and pre-pregs, for example. However, in other embodiments, different types of laminate material may be used, such as ABF (Ajinomoto Buildup Films) material.

BT-Epoxy is a mixture of epoxy resin and BT resins. This is, in turn, a mixture of bismaleimide and cyanate ester. Three cyano groups of the cyanate ester are trimerized to a triazine ring structure, hence the T in the name. In the presence of a bismaleimide the double bond of the maleimide group can copolymerize with the cyano groups to heterocyclic 6-membered aromatic ring structures with two nitrogen atoms (pyrimidines). The cure reaction occurs at temperatures up to 250° C., and is catalyzed by strongly basic molecules like Dabco (diazabicyclooctane) and 4-DMAP (4-dimethylaminopyridin). Products with very high glass transition temperatures (Tg)—up to 300 degrees C.—and very low dielectric constant can be obtained. These properties make these materials very attractive for use in PCBs.

In this example, the BT laminate material is halogen-free. These halogen-free materials achieve a flammability rating of UL94V-0 without using halogens, antimony, or phosphorus compound. The substitution of an inorganic filler as the flame retardant has the additional benefits of improving the small hole CO2 laser drilling properties, and lowering the CTE (coefficient of thermal expansion).

Each pre-preg isolation layer has a thickness in the range of 30-70 um. This allows the copper that forms coils to be much thicker than the metal used in prior digital isolation devices that are formed on a silicon substrate. This allows larger current flows to be handled for power and signal applications. Transformer performance (quality factor, efficiency) may thereby be controlled by using copper thickness of 12 um-30 um and multiple metal layers (2-8) to allow parallel inductor coils and lower coil resistance.

With reference to FIG. 1, in one aspect of this description, a transformer 100 includes a first isolation barrier IB171 extending in an axial direction (indicated in FIG. 1). The first isolation barrier IB171 includes at least two first isolation layers 102, 103. The transformer 100 also includes a first inductive element 140 disposed below the first isolation barrier IB171 and extending in the axial direction. The transformer 100 further includes a second isolation barrier IB172 disposed below the first inductive element 140 and extending in the axial direction. The second isolation barrier IB172 includes at least two second isolation layers C109, 105. The transformer 100 further includes a second inductive element 150 disposed below the second isolation barrier IB172 and extending in the axial direction. The transformer 100 further includes magnetic material 110. The magnetic material 110 includes a top magnetic portion 111 disposed above the first isolation barrier IB171 and extending in the axial direction. The magnetic material 110 also includes a bottom magnetic portion 118 disposed below the second inductive element 150 and extending in the axial direction. The magnetic material 110 further includes an intermediary magnetic portion 113 extending from the top magnetic portion 111 to the bottom magnetic portion 118 via a through-hole 119 within the first isolation barrier IB171, first inductive element 140, second isolation barrier IB172, and second inductive element 150. The magnetic material 110 yet further includes at least one lateral magnetic portion 112 extending from the top magnetic portion 111 to the bottom magnetic portion 118. Each lateral magnetic portion 112 is disposed laterally from the first isolation barrier IB171, first inductive element 140, second isolation barrier IB172, and second inductive element 150 in the axial direction.

The laminate structure of the transformer 100 comprises layers 101, 102, 103, 104, C109, 105, 106, 107, 108. Coil 140 is embedded within layer 103. Coil 141 is embedded within layer 104. Coil 150 is embedded within layer 106. Coil 151 is embedded within layer 107. The first isolation barrier IB171 includes at least two first isolation layers 102, 103. The second isolation barrier IB172 includes at least two second isolation layers C109 (which is also referred to as Core isolation layer), 105. No copper layers are provided between the at least two first isolation layers 102, 103 and between the at least two second isolation layers C109, 105.

The diameter of the through-hole may be, for example, between 900 μm and 1,100 μm.

The overall length of the magnetic material (i.e., from the bottom magnetic portion 118 to the top magnetic portion 111) may be, for example, between 400 μm and 420 μm.

The overall width of the magnetic material may be, for example, between 3,200 μm and 5,000 μm.

The overall height of the magnetic material may be, for example, between 910 μm and 1,110 μm.

Other dimensions outside these exemplary ranges may alternatively be employed depending on the transformer design.

The lateral magnetic portions 112 and/or the intermediary magnetic portion 113 may be integral with the bottom magnetic portion 118 or may be connected via a filler such as epoxy.

In an example, the through-hole 119 and intermediary magnetic portion 113 extends in a direction normal to the axial direction. The lateral magnetic portion 112 extends in a direction normal to the axial direction.

In an example, the lateral magnetic portion 112 comprises only a single lateral magnetic portion 112, and wherein a portion of each of the first isolation barrier IB171, first inductive element 140, second isolation barrier IB172, and second inductive element 150 is positioned between the intermediary magnetic portion 113 and the single lateral magnetic portion 112.

In an example, the lateral magnetic portion 112 comprises two lateral magnetic portions 112, and wherein the first isolation barrier IB171, first inductive element 140, second isolation barrier IB172, and second inductive element 150 are positioned between the two lateral magnetic portions 112. Each of the at least two first isolation layers 102, 103 comprises pre-preg. And each of the at least two second isolation layers C109, 105 comprises pre-preg. The pre-preg comprises BT.

In an example, each of the first inductive element 140 and second inductive element 150 comprises only a single layer coil which may comprise a conductive element such as copper, aluminum, tungsten, etc. Alternatively, the first inductive element 140 comprises two layer coils 140, 141 connected in series with each other. Vias may be employed to connect the two layer coils comprising the first inductive element 140 in a similar manner (e.g., using vias) to that described in U.S. Pat. No. 9,035,422. The second inductive element 150 may comprise two layer coils 150, 151 connected in series with each other. Vias may be employed to connect the two layer coils comprising the second inductive element 150 in a similar manner (e.g., using vias) to that described in U.S. Pat. No. 9,035,422. Each of the first inductive element 140 and second inductive element 150 is formed in one or more dielectric laminate layers.

In an example, a thickness of the first isolation barrier IB171 is between 70 μm and 130 μm in a direction normal to the axial direction. A thickness of the second isolation barrier IB172 is between 100 μm and 170 μm in a direction normal to the axial direction. A thickness of the transformer 100 is between 800 μm and 1200 μm in a direction normal to the axial direction.

In an example, the intermediary magnetic portion 513 (see FIG. 5) comprises a beveled upper portion 513a adjacent the top magnetic portion 511, and wherein a filler 514 is disposed between the beveled upper portion 513a and the top magnetic portion 511. The filler 514 may comprise epoxy.

Figure 4A:
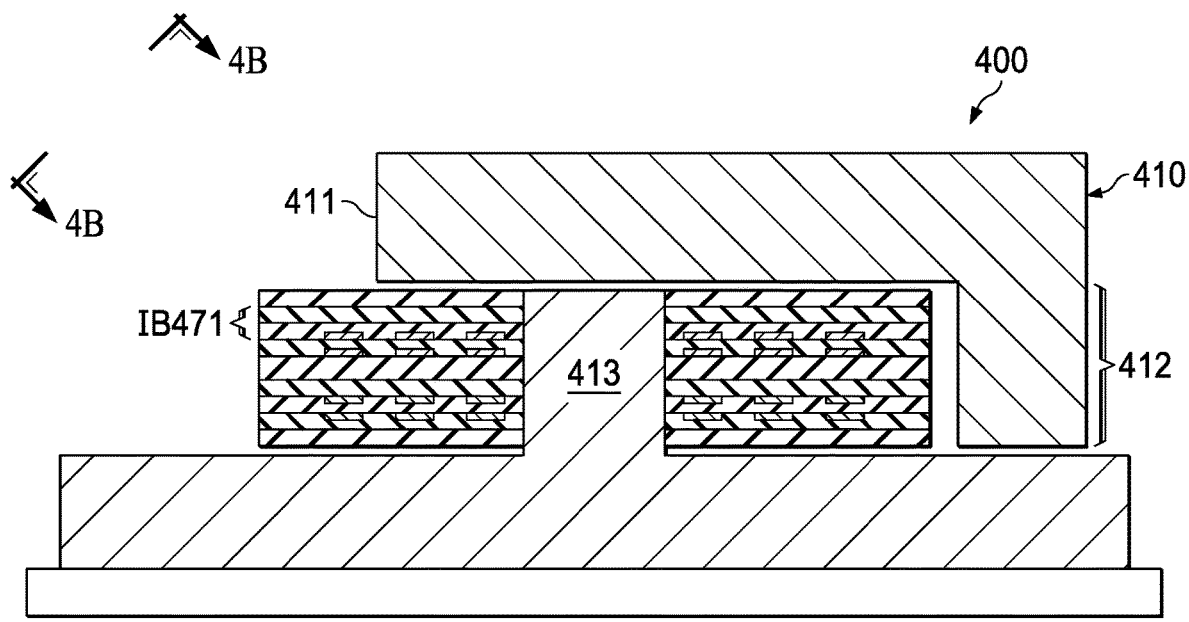
FIG. 4A is a cross-sectional schematic side view of yet another transformer similar to the transformer shown in FIG. 1 with only a single lateral magnetic portion, in accordance with this description.
Figure 4B:
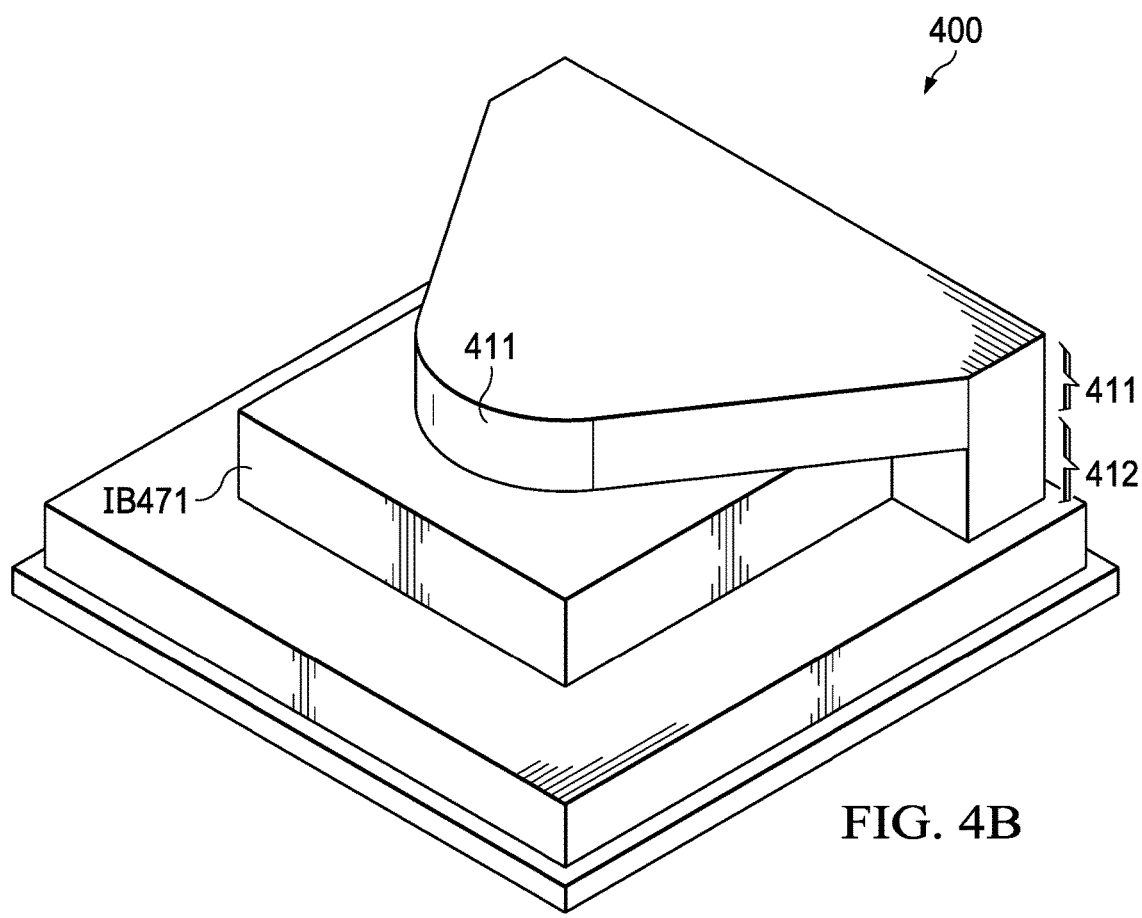
FIG. 4B is a perspective side view of the transformer shown in FIG. 4A taken along line-4B, in accordance with this description.

In an example, with reference to FIGS. 4A and 4B, at least one lateral edge of the first isolation barrier IB471 is not disposed laterally from the at least one lateral magnetic portion 412 in the axial direction.

In an example, a surface-mounted integrated circuit (IC) package comprises the transformer 100. Alternatively, a SOIC package may comprise the transformer 100.

In any aspect of this description, pre-preg may be in the dielectric laminate layer containing a coil or it could be in a separate layer.

Figure 2:
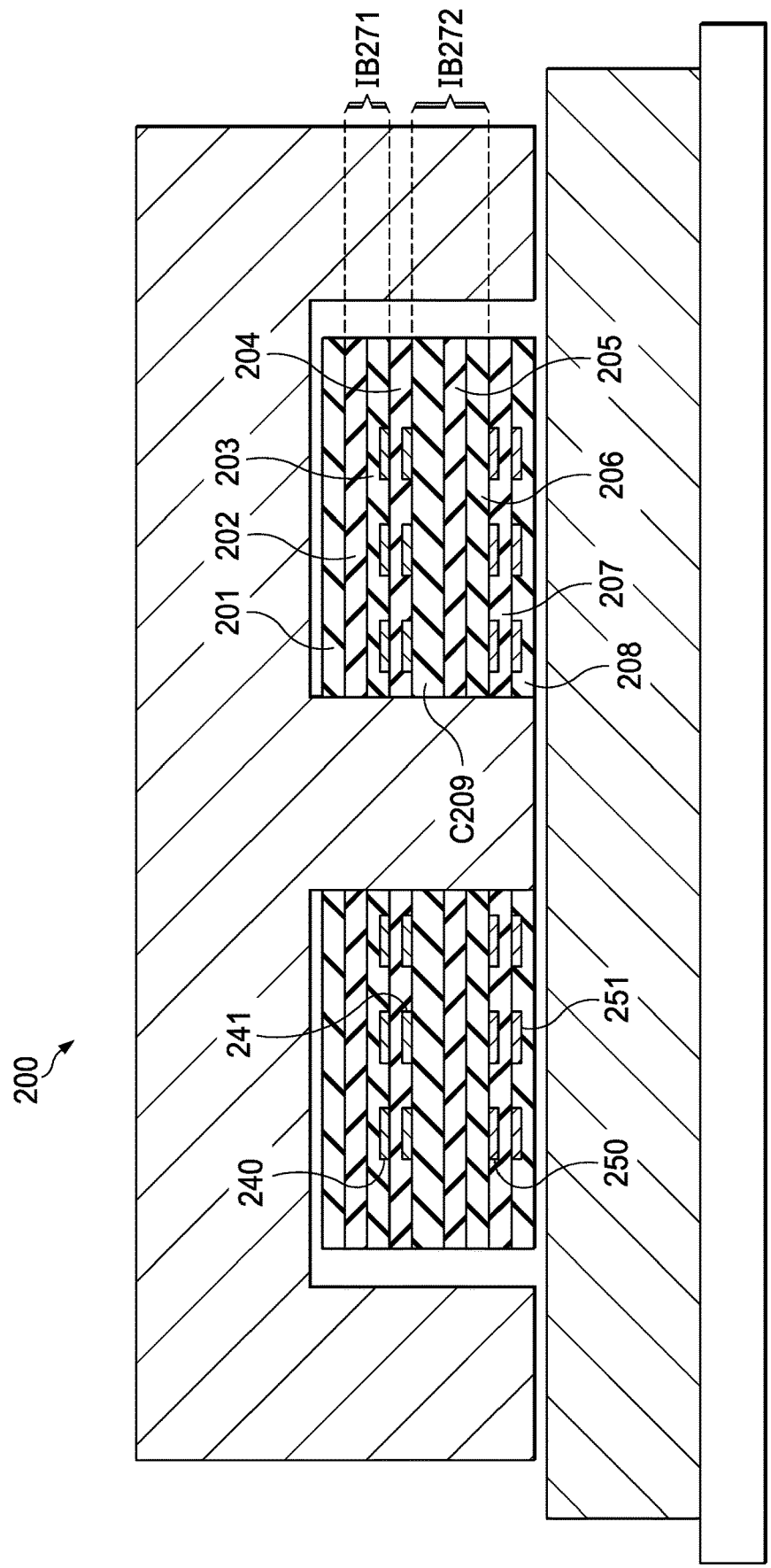
FIG. 2 is a cross-sectional side view of another transformer, in accordance with this description.

FIG. 2 is a cross-sectional side view of yet another transformer 200, in accordance with this description. The laminate structure of the transformer 200 comprises layers 201, 202, 203, 204, C209, 205, 206, 207, 208 which may comprise the same or similar materials and thicknesses as those described for the corresponding layers in the described example of FIG. 1. Coil 240 is embedded within layer 203. Coil 241 is embedded within layer 204. Coil 250 is embedded within layer 207. Coil 251 is embedded within layer 208. The first isolation barrier IB271 includes at least two first isolation layers 202, 203. The second isolation barrier IB272 includes at least two second isolation layers C209 (which is also referred to as Core isolation layer), 205, 206. No copper layers are provided between the at least two first isolation layers 202, 203 and between the at least two second isolation layers C209, 205, 206.

Figure 3A:
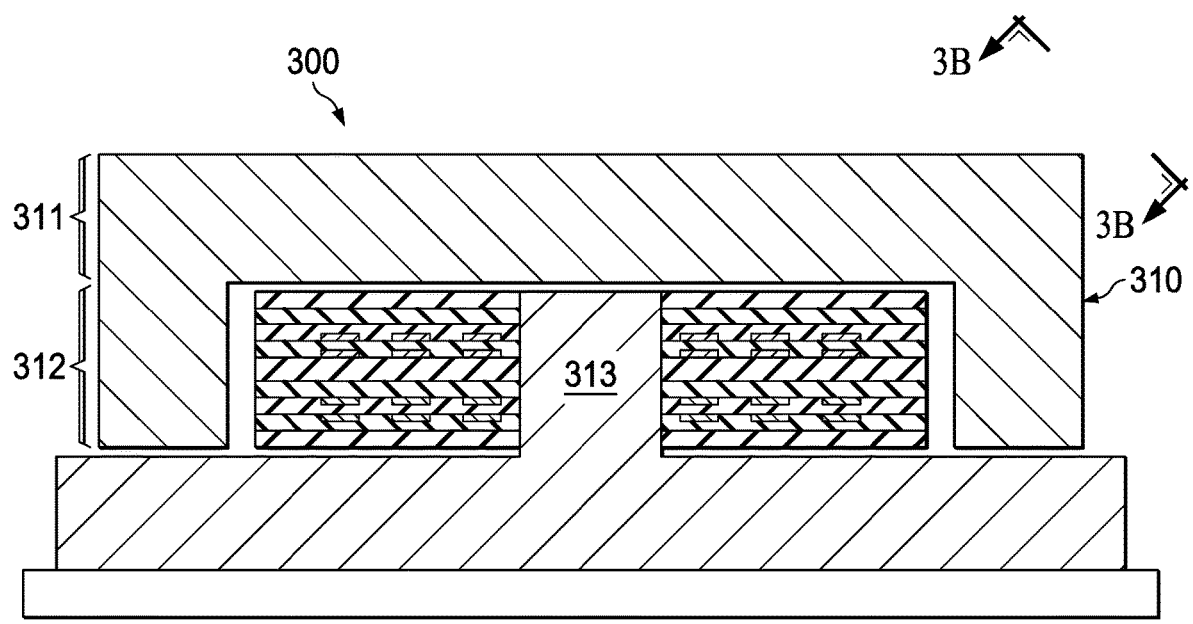
FIG. 3A is a cross-sectional schematic side view of yet another transformer similar to the transformer shown in FIG. 1, in accordance with this description.
Figure 3B:
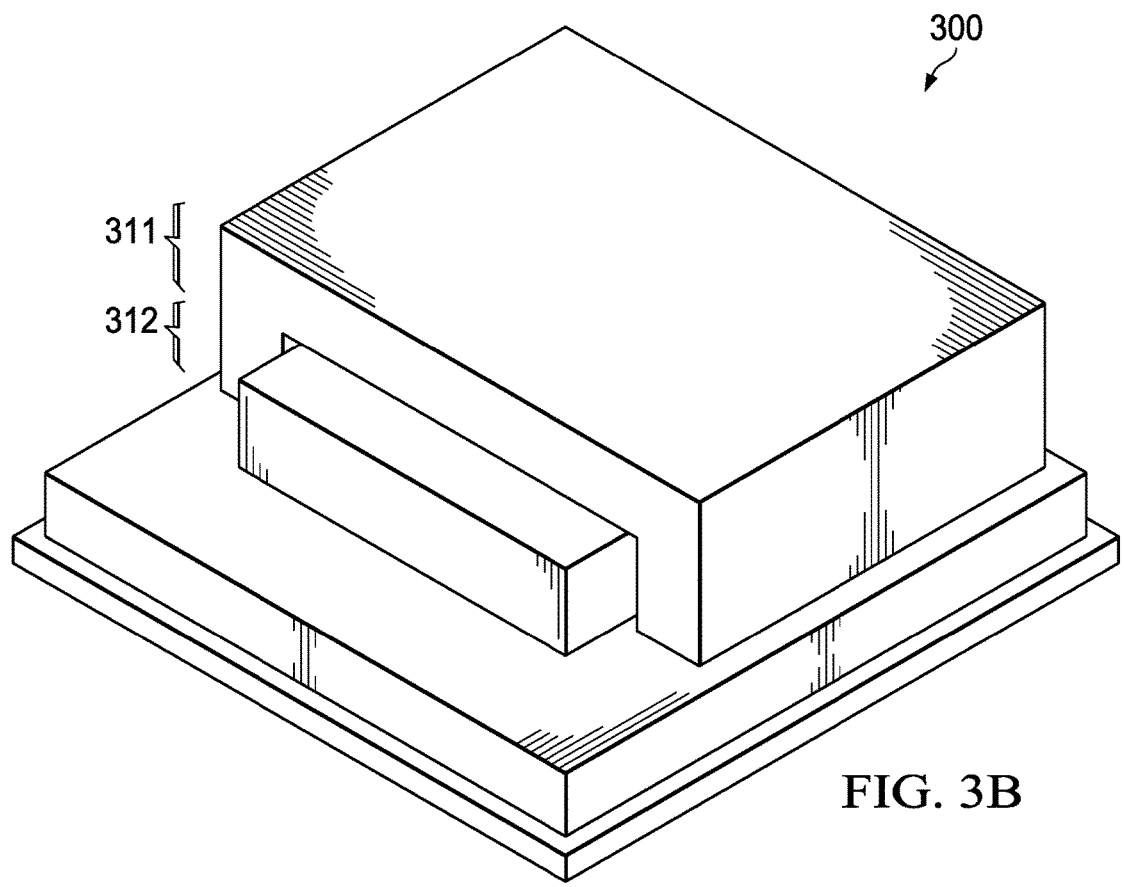
FIG. 3B is a perspective side view of the transformer shown in FIG. 3A taken along line-3B, in accordance with this description.

FIG. 3A is a cross-sectional schematic side view of yet another transformer 300 similar to the transformer 100 shown in FIG. 1, in accordance with this description. FIG. 3B is a perspective side view of the transformer 300 shown in FIG. 3A taken along line-3B, in accordance with this description. For ease of understanding of this aspect of this description, FIGS. 3A and 3B specifically identify magnetic material 310, top magnetic portion 311, intermediary magnetic portion 313, and at least one lateral magnetic portion 312.

FIG. 4A is a cross-sectional schematic side view of yet another transformer 400 similar to the transformer 100 shown in FIG. 1 with only a single lateral magnetic portion 412, in accordance with this description. FIG. 4B is a perspective side view of the transformer 400 shown in FIG. 4A taken along line-4B, in accordance with this description. For ease of understanding of this aspect of this description, FIGS. 4A and 4B specifically identify magnetic material 410, top magnetic portion 411, intermediary magnetic portion 413, and a single lateral magnetic portion 412. As seen in FIG. 4B, the top magnetic portion 411 extends partly above the underlying layers and terminates in a convex shape at or near a lateral edge of the underlying layers. While a convex shape is shown and described, other shapes may alternatively be employed as long as the termination edge of the top magnetic portion 411 is not adjacent a lateral magnetic portion. As mentioned above, the inductance density and quality factor are improved as compared to previous laminate structures. The convex shape of the top magnetic portion 411 may provide extra available area for routing the laminate structure in exposed areas which are not covered by the top magnetic portion 411.

Figure 5A:
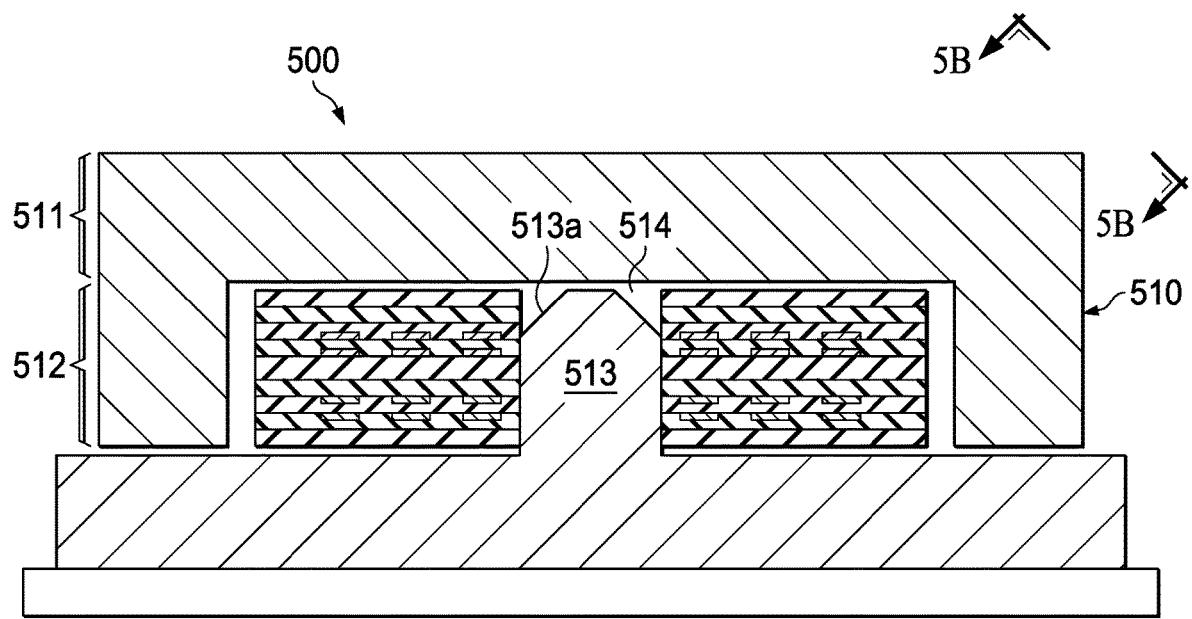
FIG. 5A is a cross-sectional schematic side view of yet another transformer similar to the transformer shown in FIG. 1 with the intermediary magnetic portion comprising a beveled upper portion adjacent the top magnetic portion, in accordance with this description.
Figure 5B:
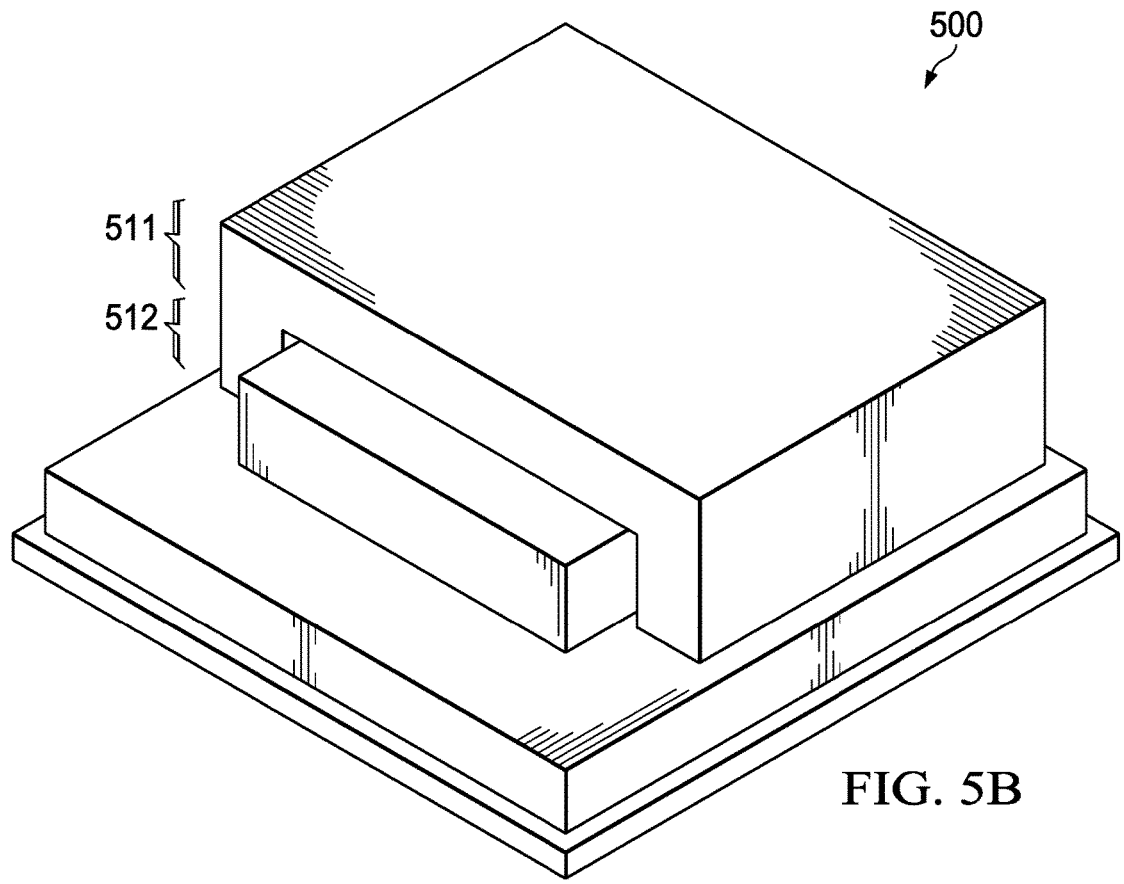
FIG. 5B is a perspective side view of the transformer shown in FIG. 5A taken along line-5B, in accordance with this description.

FIG. 5A is a cross-sectional schematic side view of yet another transformer 500 similar to the transformer 100 shown in FIG. 1 with the intermediary magnetic portion 513 comprising a beveled upper portion 513a adjacent the top magnetic portion 511, in accordance with this description. FIG. 5B is a perspective side view of the transformer 500 shown in FIG. 5A taken along line-5B, in accordance with this description. For ease of understanding of this aspect of this description, FIGS. 5A and 5B specifically identify magnetic material 510, top magnetic portion 511, intermediary magnetic portion 513, and at least one lateral magnetic portion 512. As explained above, the intermediary magnetic portion 513 comprises a beveled upper portion 513a adjacent the top magnetic portion 511. A filler 514 is disposed between the beveled upper portion 513a and the top magnetic portion 511. The beveled upper portion 513a structure can help the filler 514 flow into the gap easily between the intermediary magnetic portion 513 and laminate, therefore any air bubbles trapped in the gap can be minimized during the assembly process.

Table 1. Illustrative Layer Thicknesses for Transformer 100 of FIG. 1

TABLE 1

Illustrative layer thicknesses for transformer 100 of FIG. 1.

| Layer | Thickness | Tolerance |
|---|---|---|
| Solder mask 101 | 20 μm | +/−10 μm |
| Cu-Layer (disposed above Pre-preg 102) | 18 μm | +/−5 μm |
| Pre-preg 102 | 35 μm | +/−10 μm |
| Cu-Layer (disposed above Pre-preg 103) | 18 μm | +/−5 μm |
| Pre-preg 103 | 35 μm | +/−10 μm |
| Cu-Layer (disposed above Pre-preg 104) | 18 μm | +/−5 μm |
| Pre-preg 104 | 55 μm | +/−10 μm |
| Cu-Layer (disposed above Pre-preg C109) | 18 μm | +/−5 μm |
| Core Isolation Layer C109 (Pre-preg C109) | 60 μm | +/−15 μm |
| Cu-Layer (disposed below Pre-preg C109) | 18 μm | +/−5 μm |
| Pre-preg 105 | 55 μm | +/−10 μm |
| Cu-Layer (disposed below Pre-preg 105) | 18 μm | +/−5 μm |
| Pre-preg 106 | 35 μm | +/−10 μm |

TABLE 1-continued

Illustrative layer thicknesses for transformer 100 of FIG. 1.

| Layer | Thickness | Tolerance |
|---|---|---|
| Cu-Layer (disposed below Pre-preg 106) | 18 μm | +/−5 μm |
| Pre-preg 107 | 35 μm | +/−10 μm |
| Cu-Layer (disposed below Pre-preg 107) | 18 μm | +/−5 μm |
| Solder mask 108 | 20 μm | +/−10 μm |
| Total Thickness | 494 μm | +/−30 μm |

The copper layers (Cu-Layers) identified in Table 1 are not shown in the figures for simplicity purposes. Thicknesses of the layers of transformer 100 presented in Table 1 may similarly be employed for the corresponding layers in transformer 200 of FIG. 2. The Cu-layers may alternatively be composed of other conductive materials such as aluminum.

The discrete planar transformer can achieve good transformer performance, but may be relatively expensive and not compatible with chip integration as when employing the integrated transformer structure of this description. Moreover, discrete transformers cannot achieve reinforced isolation when the size is shrunk to an IC level.

The closed magnetic path transformer of this description, particularly EI, UI, TU-shaped transformer structures, can provide a small reluctance path for magnetic flux. The integrated closed magnetic path transformers (especially with BT laminate as part of the winding structure) have very high coupling, high inductance density, a relatively high quality factor, and which can deliver more power than other transformer structures. The double-layer pre-preg surrounding a coil in the laminate can also provide reinforced isolation to a different voltage potential, by increasing the isolation voltage between different voltage domains or potentials. The advantages of the closed magnetic path enables in very high inductance density, higher quality factor, and also enables a higher coupling coefficient.

Although examples are described above with reference to isolation barriers each having two or three isolation layers, isolation barriers with more than three isolation layers may alternatively be employed in any of the examples above. Such alternatives are considered to be within the spirit and scope of this description, and may therefore utilize the advantages of the configurations and examples described above.

The method steps in any of the examples described herein are not restricted to being performed in any particular order. Also, structures mentioned in any of the method examples may utilize structures mentioned in any of the device examples. Such structures may be described in detail with respect to the device examples only but are applicable to any of the method examples.

Features in any of the examples described in this description may be employed in combination with features in other examples described herein, such combinations are considered to be within the spirit and scope of this description.

In this description, the term "couple" or "couples" means either an indirect or direct wired or wireless connection. Thus, if a first device couples to a second device, that connection may be through a direct connection or through an indirect connection via other devices and connections.

Modifications are possible in the described embodiments, and other embodiments are possible, within the scope of the claims.

What is claimed is:

1. An integrated circuit comprising:
a first isolation barrier including first and second isolation layers without a metal layer between the first and second isolation layers, in which the first and second isolation layers each includes a respective pre-preg layer and form a first laminate having a first through-hole, the second isolation layer has opposite first and second sides, and the first side opposes the first isolation layer;
a first metal layer embedded in the second side of the second isolation layer, the first metal layer including a primary coil of a transformer;
a second isolation barrier including third and fourth isolation layers without a metal layer between the third and fourth isolation layers, in which the third and fourth isolation layers each includes a respective pre-preg layer and form a second laminate having a second through-hole, the fourth isolation layer has opposite third and fourth sides, and the third side opposes the third isolation layer;
a second metal layer embedded in the fourth side of the fourth isolation layer, the second metal layer including a secondary coil of the transformer;
magnetic material having a first magnetic portion over at least a portion of the first isolation barrier, a second magnetic portion over all of the second metal layer, and a third magnetic portion between the first and second magnetic portions and extending through the first and second through-holes; and
a lead frame on which the second magnetic portion is mounted, in which the second magnetic portion is between the second metal layer and the lead frame.

2. The integrated circuit of claim 1, wherein the first and second isolation barriers extend along a first direction; and
wherein the first and second through-holes and the third magnetic portion extend along a second direction normal to the first direction.

3. The integrated circuit of claim 1, wherein the magnetic material includes a fourth magnetic portion between the first and second magnetic portions and external to the first and second isolation barriers.

4. The integrated circuit of claim 3, wherein the magnetic material includes a fifth magnetic portion connecting the first and second magnetic portions and external to the first and second isolation barriers; and
wherein the first isolation barrier, the first metal layer, the second isolation barrier, and the second metal layer are between the fourth and fifth magnetic portions.

5. The integrated circuit of claim 1, wherein at least one of the first through fourth isolation layers includes bismaleimide triazine (BT).

6. The integrated circuit of claim 1, wherein at least one of the first through fourth isolation layers includes fabric and resin materials.

7. The integrated circuit of claim 6, wherein the resin materials include bismaleimide triazine (BT).

8. The integrated circuit of claim 1, further comprising a third metal layer between the first metal layer and the second isolation barrier, and a fourth metal layer between the second metal layer and the second magnetic portion.

9. The integrated circuit of claim 8, wherein the first and third metal layers include the primary coil.

10. The integrated circuit of claim 8, wherein the second and fourth metal layers include the secondary coil.

11. The integrated circuit of claim 1, wherein the first isolation barrier includes a first dielectric layer and the second isolation barrier includes a second dielectric layer,
wherein the first metal layer is embedded in the first dielectric layer; and
wherein the second metal layer is embedded in the second dielectric layer.

12. The integrated circuit of claim 1, wherein a thickness of the first isolation barrier is between 70 µm and 130 µm.

13. The integrated circuit of claim 1, wherein a thickness of the second isolation barrier is between 100 µm and 170 µm.

14. The integrated circuit of claim 1, wherein a thickness of the transformer is between 800 µm and 1200 µm.

15. The integrated circuit of claim 1, wherein the third magnetic portion includes a beveled portion facing the first magnetic portion, and wherein the transformer includes a filler between the beveled portion and the first magnetic portion.

16. The integrated circuit of claim 15, wherein the filler comprises epoxy.

17. The integrated circuit of claim 1, wherein the first magnetic portion has a convex shape.

18. The integrated circuit of claim 1, wherein the integrated circuit is part of a surface-mounted integrated circuit.

19. The integrated circuit of claim 1, wherein the integrated circuit is part of a small outline integrated circuit.

20. The integrated circuit of claim 1, further comprising a first solder mask layer between the first magnetic portion and the first isolation barrier, and a second solder mask layer between the second metal layer and the second magnetic portion.

21. The integrated circuit of claim 1, wherein the second isolation barrier includes a fifth isolation layer between the third and fourth isolation layers.

22. An integrated circuit comprising:
a first isolation barrier including first and second isolation layers without a metal layer, in which the first and second isolation layers each includes a respective pre-preg layer and form a first laminate having a first through-hole, the second isolation layer has opposite first and second sides, and the first side opposes the first isolation layer;
a first metal layer on or embedded in the second side of the second isolation layer, the first metal layer including a primary coil of a transformer;
a second isolation barrier having opposite third and fourth sides and a second through-hole, in which the third side opposes the first metal layer and the first isolation barrier;
a second metal layer embedded in the fourth side of the second isolation barrier, the second metal layer including a secondary coil of the transformer;
magnetic material having a first magnetic portion over at least a portion of the first isolation barrier, a second magnetic portion over all of the second metal layer, and a third magnetic portion connecting the first and second magnetic portions and extending through the first and second through-holes; and
a lead frame on which the second magnetic portion is mounted, in which the second magnetic portion is between the second metal layer and the lead frame.

23. The integrated circuit of claim 22, wherein at least one of the first and second isolation layers include bismaleimide triazine (BT).

24. The integrated circuit of claim 22, further comprising a fourth magnetic portion between the first and second magnetic portions and external to the first and second isolation barriers.

25. The integrated circuit of claim 22, wherein the second isolation barrier includes third and fourth isolation layers without a metal layer between the third and fourth isolation layers, in which the third and fourth isolation layers each includes a respective pre-preg layer and form a second laminate having the second through-hole.

26. The integrated circuit of claim 25, wherein the second isolation barrier includes a fifth isolation layer between the third and fourth isolation layers.

* * * * *